United States Patent
Nakanishi et al.

(10) Patent No.: US 9,585,246 B2
(45) Date of Patent: *Feb. 28, 2017

(54) ELECTRONIC DEVICE

(71) Applicant: FUJITSU LIMITED, Kanagawa (JP)

(72) Inventors: Teru Nakanishi, Kawasaki (JP);
Nobuyuki Hayashi, Kawasaki (JP);
Masaru Morita, Kawasaki (JP);
Yasuhiro Yoneda, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/062,480

(22) Filed: Mar. 7, 2016

(65) Prior Publication Data

US 2016/0192498 A1    Jun. 30, 2016

Related U.S. Application Data

(60) Division of application No. 13/212,467, filed on Aug. 18, 2011, now Pat. No. 9,318,425, which is a
(Continued)

(30) Foreign Application Priority Data

Mar. 19, 2009    (JP) .................................. 2009-069091

(51) Int. Cl.
*H05K 1/11*    (2006.01)
*H05K 1/14*    (2006.01)
(Continued)

(52) U.S. Cl.
CPC ............ *H05K 1/0296* (2013.01); *H01L 23/13* (2013.01); *H01L 23/4985* (2013.01);
(Continued)

(58) Field of Classification Search
CPC ........ H05K 1/189; H05K 1/141; H05K 1/147; H05K 2201/10734
(Continued)

(56) References Cited

U.S. PATENT DOCUMENTS

| | | |
|---|---|---|
| 5,770,891 A | 6/1998 | Frankeny et al. |
| 6,050,832 A | 4/2000 | Lee et al. |

(Continued)

FOREIGN PATENT DOCUMENTS

| | | |
|---|---|---|
| EP | 1667225 A1 | 6/2006 |
| EP | 1677349 A1 | 7/2006 |

(Continued)

OTHER PUBLICATIONS

Extended European Search Report dated Aug. 27, 2014, issued in counterpart application No. 09841905.4.

(Continued)

*Primary Examiner* — Tuan T Dinh
(74) *Attorney, Agent, or Firm* — Kratz, Quintos & Hanson, LLP

(57) ABSTRACT

A semiconductor device includes: a wiring board including a first electrode pad on a surface thereof; a circuit board disposed to stand on the wiring board, and including an interconnection connected to the first electrode pad; and a semiconductor package disposed to face the wiring board with the circuit board interposed therebetween, and including a second electrode pad on a surface thereof, the second electrode pad being connected to the interconnection.

1 Claim, 23 Drawing Sheets

Related U.S. Application Data continuation of application No. PCT/JP2009/067856, filed on Oct. 15, 2009.

(51) Int. Cl.

| | | |
|---|---|---|
| *H05K 1/02* | (2006.01) | |
| *H01L 23/13* | (2006.01) | |
| *H01L 23/498* | (2006.01) | |
| *H05K 3/34* | (2006.01) | |
| *H05K 1/18* | (2006.01) | |
| *H01L 23/00* | (2006.01) | |

(52) U.S. Cl.
CPC .. *H01L 23/49811* (2013.01); *H01L 23/49827* (2013.01); *H01L 23/49833* (2013.01); *H05K 1/181* (2013.01); *H05K 3/3436* (2013.01); *H01L 23/49822* (2013.01); *H01L 24/16* (2013.01); *H01L 24/81* (2013.01); *H01L 2224/0401* (2013.01); *H01L 2224/05647* (2013.01); *H01L 2224/1379* (2013.01); *H01L 2224/13839* (2013.01); *H01L 2224/13847* (2013.01); *H01L 2224/16225* (2013.01); *H01L 2224/16235* (2013.01); *H01L 2224/81193* (2013.01); *H01L 2224/81801* (2013.01); *H01L 2924/01004* (2013.01); *H01L 2924/01078* (2013.01); *H01L 2924/01079* (2013.01); *H01L 2924/12042* (2013.01); *H01L 2924/15311* (2013.01); *H05K 2201/10287* (2013.01); *H05K 2201/10378* (2013.01); *H05K 2201/10424* (2013.01); *H05K 2201/10719* (2013.01); *Y02P 70/613* (2015.11)

(58) Field of Classification Search
USPC ......... 361/748–750, 761–764, 792–795, 803
See application file for complete search history.

(56) References Cited

U.S. PATENT DOCUMENTS

| | | |
|---|---|---|
| 6,208,521 B1 | 3/2001 | Nakatsuka |
| 6,476,503 B1 | 11/2002 | Imamura |
| 6,875,921 B1 | 4/2005 | Conn |
| 6,946,743 B2 | 9/2005 | Silverbrook |
| 2003/0047801 A1 | 3/2003 | Azuma |
| 2005/0118845 A1 | 6/2005 | Kobayashi |
| 2006/0077644 A1 | 4/2006 | Nickerson et al. |
| 2006/0163740 A1 | 7/2006 | Ohno et al. |
| 2006/0202322 A1 | 9/2006 | Kariya et al. |
| 2009/0121346 A1 | 5/2009 | Wachtler |

FOREIGN PATENT DOCUMENTS

| | | |
|---|---|---|
| EP | 1701383 A1 | 9/2006 |
| JP | 5-114627 | 5/1993 |
| JP | 8-236898 | 9/1996 |
| JP | 2001-118876 A1 | 4/2001 |
| JP | 2005-510618 A1 | 4/2005 |
| JP | 2005-268544 A1 | 9/2005 |
| WO | 2008/114434 A1 | 9/2008 |

OTHER PUBLICATIONS

Chinese Office Action dated Apr. 3, 2013, with English Translation, in counterpart Chinese Application No. 200980158127.3.
International Search Report for International Application No. PCT/JP2009/067856 dated Oct. 29, 2009.
M. Morita, et al., "Highly acceleration Test on Lead-Free Solder", 23rd Spring Lecture Meeting of Japan Institute of Electronics Packaging; 9 sheets/p. 3 of specification.
US Office Action dated Jun. 1, 2016 for U.S. Appl. No. 15/062,477, which is a divisional application of U.S. Appl. No. 13/212,467. U.S. Appl. No. 13/212,467 is the parent of the subject application.
US Office Action dated Jul. 27, 2016 for U.S. Appl. No. 15/062,477, which is a divisional application of U.S. Pat. No. 9,318,425. U.S. Pat. No. 9,318,425 is the parent of the subject application.

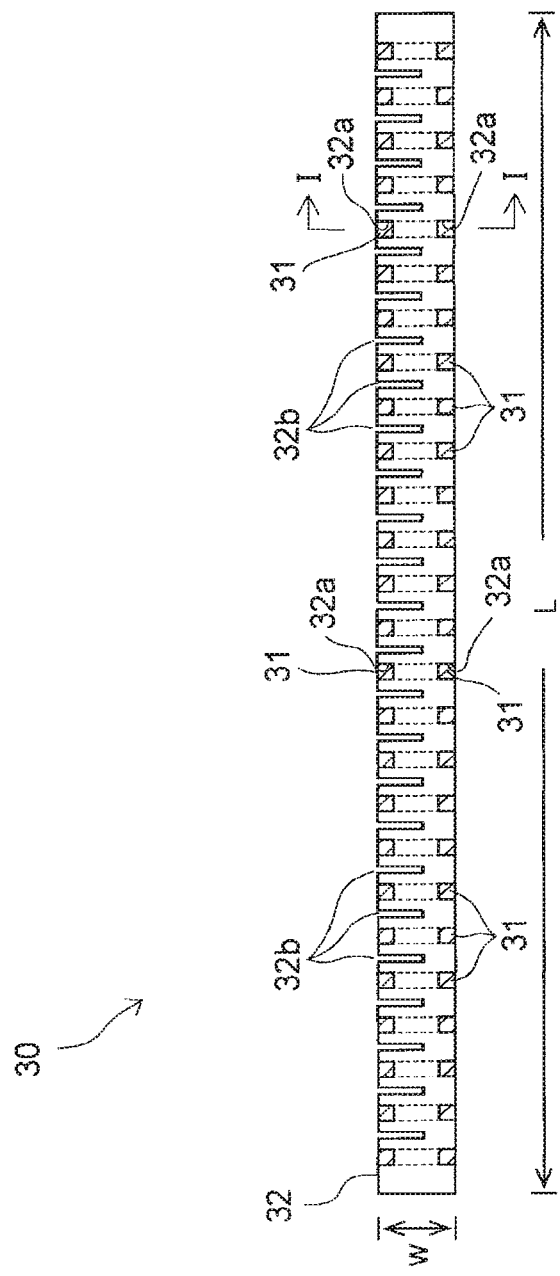

ELECTRONIC DEVICE

CROSS-REFERENCE TO RELATED APPLICATIONS

This application is a divisional application of U.S. application Ser. No. 13/212,467, filed Aug. 18, 2011 which is a continuation application of the prior International Application PCT/JP2009/067856, filed on Oct. 15, 2009, which claims benefit to Japanese Application 2009-069091, filed Mar. 19, 2009, the entire contents of which are incorporated herein by reference in their entireties.

FIELD

The embodiments discussed herein are related to a semiconductor device, a method of manufacturing the same, an electronic device, and an electronic component.

BACKGROUND

Recently, electronic devices such as servers and personal computers have been remarkably developed in terms of advancements in speed, performance, and the like, and accordingly semiconductor elements such as CPU (Central Processing Unit) used in the electronic devices have been progressively increased in size.

As a mounting technology for semiconductor elements, flip chip mounting is known in which a semiconductor element in the form of bare chip is directly mounted on a wiring board with a solder hump.

Additionally, to scale up the fine electrode arrangement of semiconductor elements to the electrode arrangement of a wiring board, there is also a mounting method in a BGA (Ball Grid Array) approach in which a semiconductor package having a semiconductor element placed on an interposer is fabricated and mounted on a wiring board with a solder bump interposed therebetween. The semiconductor package for BGA approach is also called a BGA semiconductor package.

FIGS. 1A and 1B are cross-sectional views of a BGA semiconductor package 5 in the course of the mounting thereof on a wiring board 1.

As illustrated in FIG. 1A, the wiring board 1 has first electrode pads 2 on one main surface thereof. A solder paste 4 is printed in advance on the first electrode pads 2 by screen printing.

On the other hand, the semiconductor package 5 includes second electrode pads 6 on a main surface thereof at positions facing the first electrode pads 2. Further, solder bumps 7 are bonded to the upper surfaces of the second electrode pads 6.

Then, while the solder bumps 7 are in contact with the solder paste 4, these are reflowed by heating. Thereby, the semiconductor package 5 is mounted on the wiring board 1 as illustrated in FIG. 1B. The surface tension of the solder and the own weight of the semiconductor package 5 determine the shape of the solder bumps 7 after the reflowing, which is normally a drum-like shape bulging at the center as illustrated.

Meanwhile, the semiconductor package 5 and wiring board 1 have different thermal expansion coefficients because of the difference in materials. Accordingly, as the semiconductor package 5 generates heat, stress is applied on the solder bumps 7 due to the difference in thermal expansion coefficient. The stress concentrates on portions of the solder bumps 7 where the diameter is the smallest, in other words, around bonded portions A between the electrode pads 2, 6 and the solder bumps 7.

As the power supply of the semiconductor package 5 is turned on and off repeatedly, the stress is repeatedly applied to the solder bumps 7 in the bonded portions A. Thus, metal fatigue gradually progresses at the solder bumps 7. Eventually, a crack is generated in the solder bumps 7, and the bonded portions A may be fractured.

Patent Literature 1: Japanese Laid-open Patent Publication No. 05-114627
Patent Literature 2: International Publication Pamphlet No. WO 08/114434
Patent Literature 3: Japanese Laid-open Patent Publication No. 2001-118876
Patent Literature 4: Japanese Laid-open Patent Publication No. 08-236898
Patent Literature 5: Japanese National Publication of International Patent Application No. 2005-510618
Non-patent Literature 1: Morita, Hayashi, Nakanishi, and Yoneda, "High Acceleration Test of Lead-free Solder", $23^{rd}$ Spring Lecture Meeting of Japan Institute of Electronics Packaging

SUMMARY

According to an aspect of the following disclosure, there is provided a semiconductor device including: a wiring board including a first electrode pad on a surface thereof; a circuit board disposed to stand on the wiring board, and including an interconnection connected to the first electrode pad; and a semiconductor component disposed to face the wiring board with the circuit board interposed therebetween, and including a second electrode pad on a surface thereof, the second electrode pad being connected to the interconnection.

Moreover, according to another aspect of the disclosure, there is provided an electronic device including a semiconductor device mounted thereon, the semiconductor device including: a wiring board including a first electrode pad on a surface thereof; a circuit board disposed to stand on the wiring board, and including an interconnection connected to the first electrode pad; and a semiconductor component disposed to face the wiring board with the circuit board interposed therebetween, and including a second electrode pad on a surface thereof, the second electrode pad being connected to the interconnection.

Further, according to another aspect of the disclosure, there is provided an electronic component including: a wiring board including a first electrode pad on a surface thereof; and a circuit board disposed to stand on the wiring board, and including an interconnection for connecting the first electrode pad to a second electrode pad of a semiconductor element to be mounted on the wiring board.

In addition, according to still another aspect of the disclosure, there is provided a method of manufacturing a semiconductor device, the method including: standing a circuit board on a wiring board including a first electrode pad on a surface thereof; connecting the first electrode pad to an interconnection of the circuit board; mounting a semiconductor component on the circuit board in such a manner that the semiconductor component faces the wiring board with the circuit board interposed therebetween; and connecting the interconnection of the circuit board to a second electrode pad disposed on a surface of the semiconductor component.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 2 is a plan view of a flexible circuit board used in each embodiment;

DESCRIPTION OF EMBODIMENTS

Hereinafter, the present embodiments will be described in detail with reference to the attached drawings.

(1) First Embodiment

FIG. 2 is a plan view of a stress-absorbing flexible circuit board 30 used in the present embodiment.

The flexible circuit board 30 has a flexible band-shaped resin base material 32 and interconnections 31 buried in the resin base material 32. The size of the resin base material 32 is not particularly limited. However, in this embodiment, the length L is approximately 40 mm and the width W is approximately 2 mm.

The interconnections 31 are formed to extend in a short-side direction of the band-shaped resin base material 32. As the material of the interconnections 31, for example, copper is used.

A plurality of such interconnections 31 are formed in the resin base material 32 at intervals of approximately 1.27 mm. A slit 32b is formed in the resin base material 32 at a position between each adjacent two of the interconnections 31.

Figure 3:
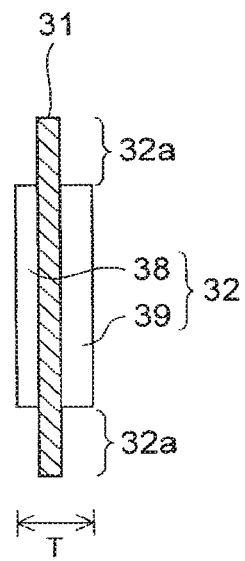
FIG. 3 is a cross-sectional view taken along the line I-I in FIG. 2.

FIG. 3 is a cross-sectional view taken along the line I-I in FIG. 2.

As illustrated in FIG. 3, the resin base material 32 includes a first resin film 38 and a second resin film 39 which are both made of polyimide and are stacked on each other. The interconnection 31 is buried between these resin films 38, 39.

The thickness T of the resin base material 32 combining these resin films 38, 39 is not particularly limited, but is approximately 0.1 mm in this embodiment.

Moreover, the resin base material 32 has openings 32a formed at portions approximately 0.5 mm from both ends of the interconnection 31, and end portions of the interconnection 31 are exposed from the openings 32a. Incidentally, surface treatment such as gold plating may be performed on the portions of the interconnection 31 exposed from the openings 32a to prevent oxidation and to improve bonding.

Figure 4A:
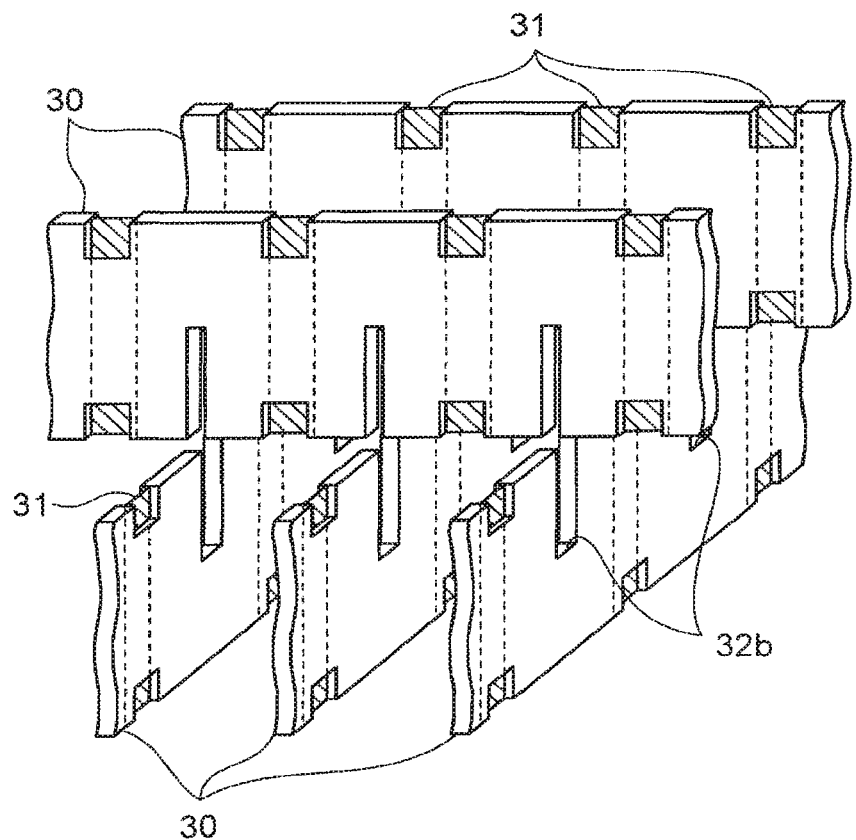
FIGS. 4A and 4B are perspective views illustrating a way of using a flexible circuit board according to a first embodiment.
Figure 4B:
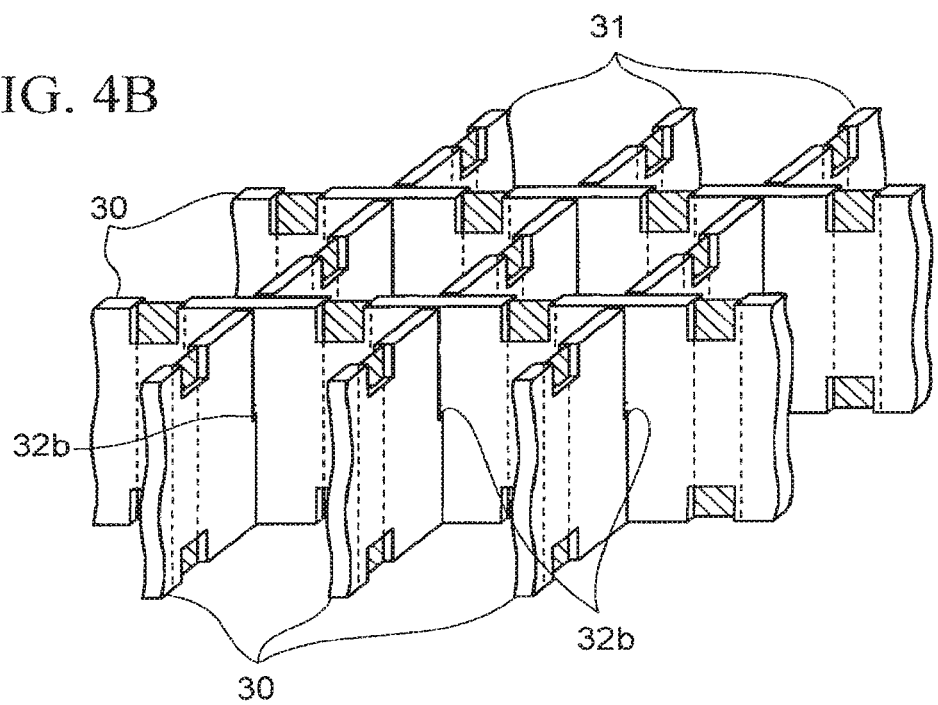

FIGS. 4A and 4B are perspective views illustrating a way of using the stress-relaxing flexible circuit board 30.

As illustrated in FIG. 4A, in this embodiment, a plurality of the flexible circuit boards 30 are prepared, and the slits 32b thereof are fitted to each other.

Thereby, as illustrated in FIG. 4B, the flexible circuit boards 30 are assembled in a lattice pattern. Thus, the flexible circuit boards 30 come to stand by themselves without support.

Here, to prevent the flexible circuit boards 30 from varying in height, the depths of the slits 32b are preferably approximately half the width W of each flexible circuit board 30 (see FIG. 2).

Figure 5:
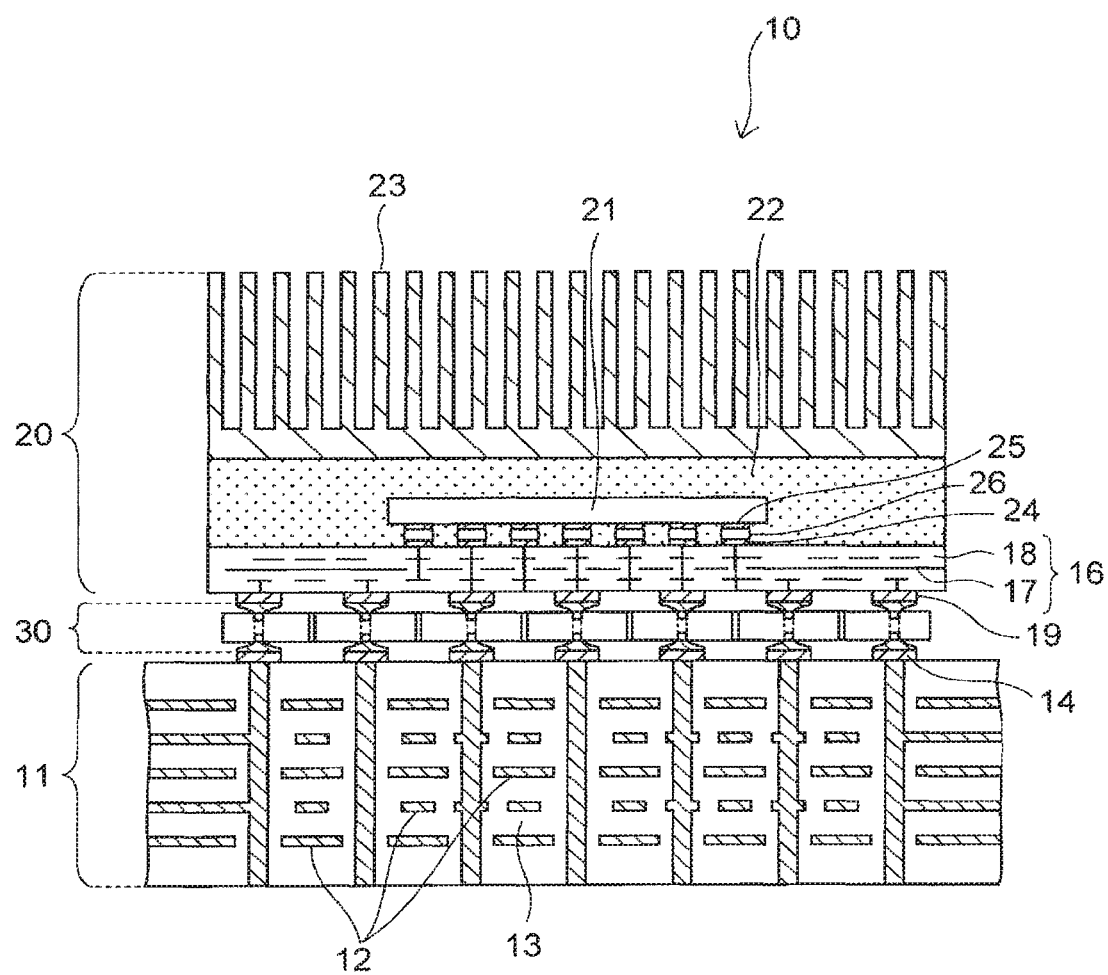
FIG. 5 is a cross-sectional view of a semiconductor device according to the first embodiment.

FIG. 5 is a cross-sectional view of a semiconductor device using the flexible circuit boards 30 thus assembled.

This semiconductor device 10 has a wiring board 11 and a semiconductor package 20 as a semiconductor component facing the wiring board 11 with the flexible circuit boards 30 interposed therebetween.

Among them, the wiring board 11 is a multilayer wiring board including interconnections 12 made of copper and insulating layers 13 made of a glass epoxy resin which are alternately stacked. First electrode pads 14 made of copper are disposed on the surface of the uppermost layer of the wiring board 11.

Moreover, the semiconductor package 20 includes a semiconductor element 21 such as CPU mounted on an interposer 16, and a sealing resin 22 sealing the semiconductor element 21 and the interposer 16.

Among them, the interposer 16 is a multilayer wiring board including a plurality of interconnections 17 made of copper and insulating layers 18 made of a glass epoxy resin which are alternately stacked. The interposer 16 has second and third electrode pads 19, 24 made of copper on the surfaces of the lowermost layer and the uppermost layer thereof, respectively.

In addition, the semiconductor element 21 includes fourth electrode pads 25 made of copper. The fourth electrode pads 25 and the third electrode pads 24 of the interposer 16 are electrically and mechanically connected to each other with solder bumps 26.

Further, a heat sink 23 for efficiently dissipating heat generated from the semiconductor element 21 firmly adheres to the surface of the sealing resin 22. The heat sink 23 is made of a metal having a favorable thermal conductivity, for example, aluminum.

Figure 6:
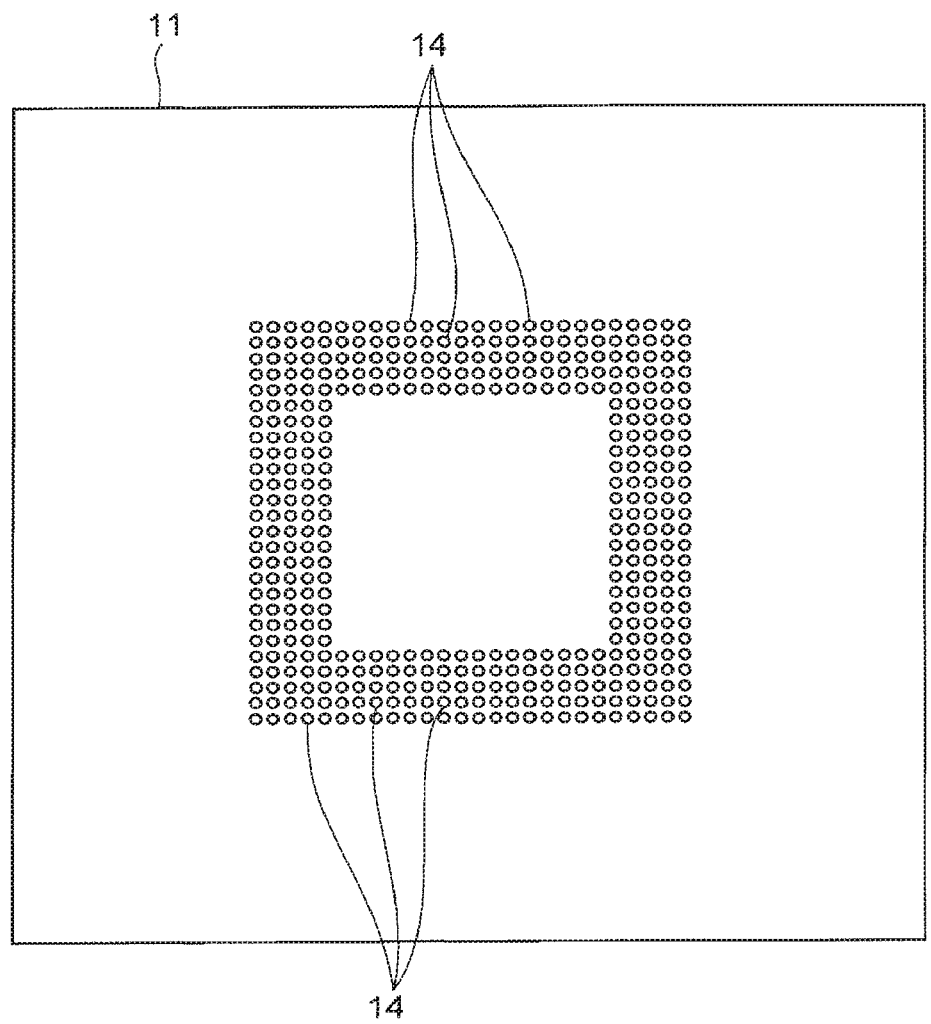
FIG. 6 is a plan view of a wiring board used in each embodiment.

FIG. 6 is a plan view of the wiring board 11.

As illustrated in FIG. 6, the planar shape of the wiring board 11 is a square shape with a length of one side thereof being approximately 110 mm, and 26×26 of the first electrode pads 14 are arranged in a lattice pattern thereon but 16×16 of the first electrode pads 14 in the central region are excluded. Moreover, the size of each first electrode pad 14 is not particularly limited, but the first electrode pad 14 is in a circular shape having a diameter of approximately 0.76 mm in this embodiment.

Figure 7:
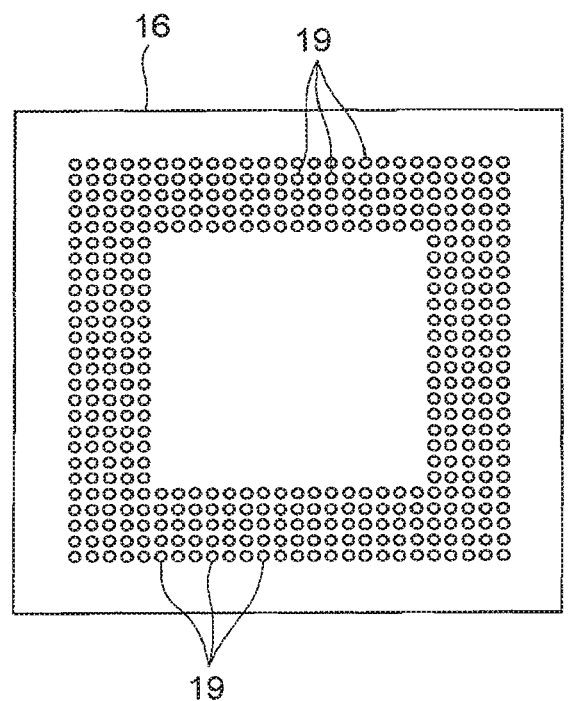
FIG. 7 is a plan view of an interposer of a semiconductor package used in each embodiment.

Meanwhile, FIG. 7 is a plan view of the interposer 16 included in the semiconductor package 20.

As illustrated in FIG. 7, the planar shape of the interposer 16 is a square shape with a length of one side thereof being approximately 40 mm. Moreover, the second electrode pads 19 disposed on the interposer 16 are each in a circular shape having a diameter of approximately 0.76 mm, and have the same arrangement pattern as the first electrode pads 14 illustrated in FIG. 6.

Figure 8A:
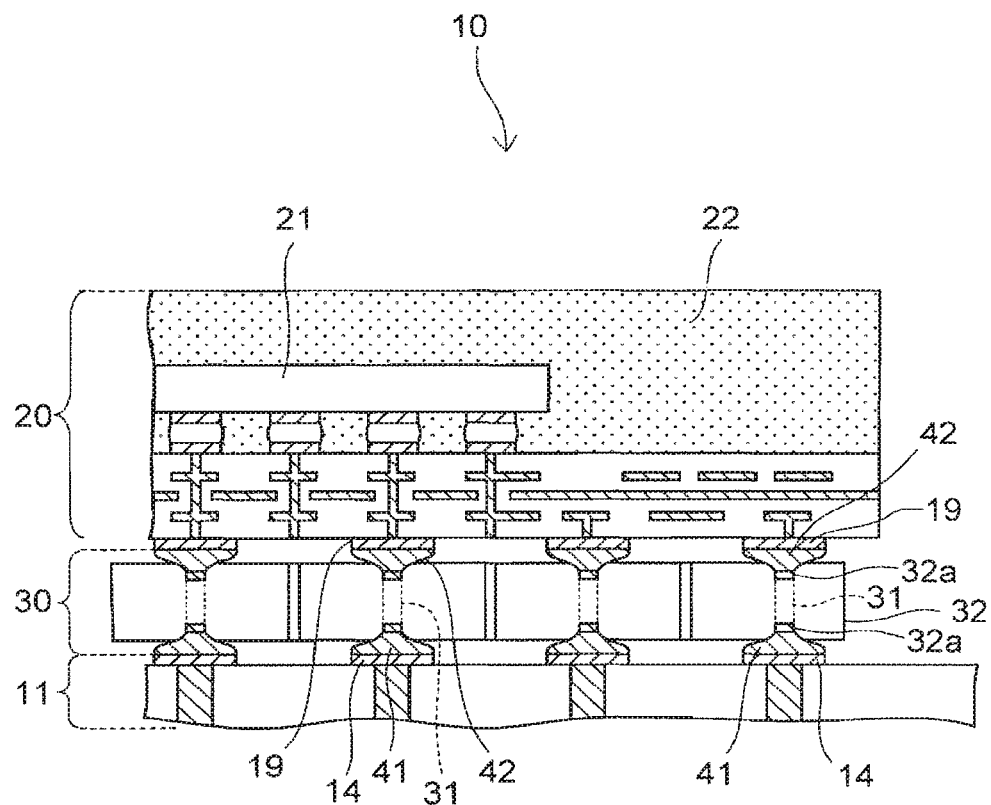
FIGS. 8A and 8B are enlarged cross-sectional views of the flexible circuit board and its surrounding in the semiconductor device according to the first embodiment.
Figure 8B:
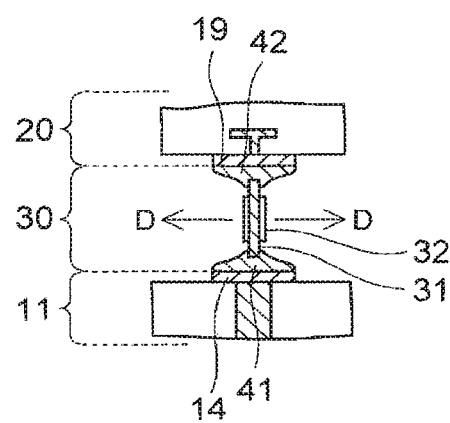

FIGS. 8A and 8B are enlarged cross-sectional views of the flexible circuit board 30 and its surrounding in the semiconductor device 10. Among them, FIG. 8A is an enlarged, cross-sectional view taken parallel to an extending direction of the flexible circuit board 30, while FIG. 83 is an enlarged cross-sectional view taken along a direction perpendicular to the extending direction of the flexible circuit board 30.

As illustrated in FIGS. 8A and 8B, the band-shaped flexible circuit boards 30 are disposed to stand on the wiring board 11, and extend in a lateral direction of the wiring board 11 in such a manner as to run on the first electrode pads 14.

Moreover, the portions of the interconnection 31 of the flexible circuit board 30 exposed from the openings 32a of the resin base material 32 are mechanically and electrically connected to the first and second electrode pads 14, 19 respectively with first and second connection media 41, 42 such as Sn-3Ag-0.5Cu solder interposed therebetween.

Such connections between the interconnection 31 and the connection media 41, 42 at the openings 32a increase the contact area between the interconnection 31 and the connection media 41, 42, and improve the connection reliability between the wiring board 11 and the semiconductor package 20 with the circuit boards 30 interposed therebetween, in comparison with a case where no opening 32a is provided.

Note that the connection media 41, 42 are not limited to solder and may be a conductive adhesive. Such a conductive adhesive is obtained by, for example, kneading a binder such as an epoxy resin, a urethane resin, a silicone resin, an acrylic resin, and a polyimide resin with a conductive filler such as silver and copper.

By standing the flexible circuit boards 30 on the wiring board 11 in this manner, it may be possible to urge the flexible circuit boards 30 to deform in in-plane directions D of the wiring board 11 when the wiring board 11 or the semiconductor package 20 thermally expands as illustrated in FIG. 8B.

Figure 9:
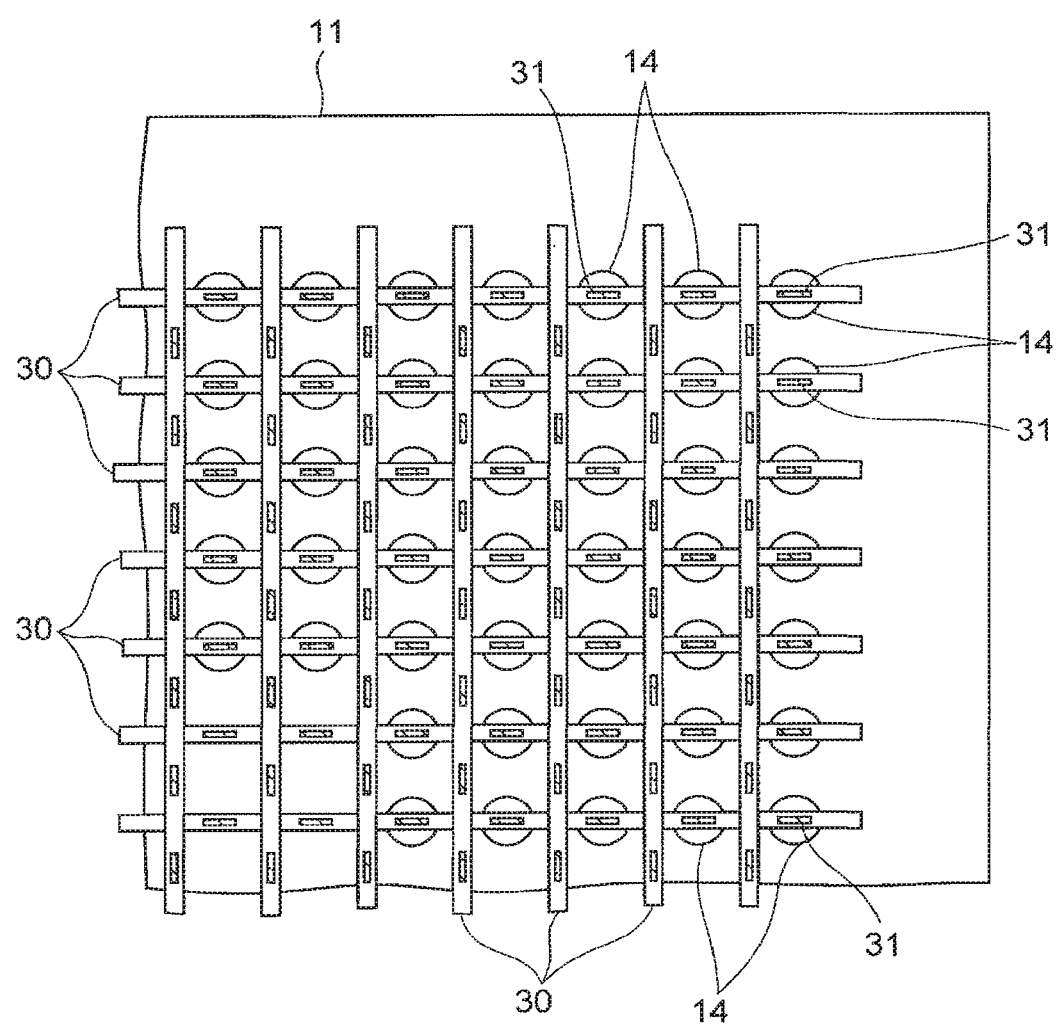
FIG. 9 is an enlarged plan view of the semiconductor device according to the first embodiment.

FIG. 9 is an enlarged plan view of the semiconductor device. Note that, in FIG. 9, the semiconductor package 20 is omitted to facilitate visualization of the planar layout of the flexible circuit boards 30.

As illustrated in FIG. 9, the plurality of flexible circuit boards 30 assembled in the lattice pattern are positioned to the wiring board 11 in such a manner that the interconnections 31 are located above the first electrode pads 14.

In the semiconductor device 10 described above, the flexible circuit boards 30 are disposed between the wiring board 11 and the semiconductor package 20 as illustrated in FIGS. 8A and 8B.

Accordingly, the flexible circuit boards 30 themselves deform to absorb the difference in thermal expansion between the wiring board 11 and the semiconductor package 20 caused by heat generated from the semiconductor package 20. This may enable prevention of stress from concentrating on bonded portions between the flexible circuit boards 30 and the first and second electrode pads 14, 19. Hence, a risk of fracturing bonding between the interconnections 31 of the circuit boards 30 and the first and second electrode pads 14, 19 due to the concentration of stress is reduced. Thus, improvement in connection reliability between the circuit boards 30 and the semiconductor package 20 may be possible.

Particularly, in this embodiment, since the flexible circuit boards 30 are disposed to stand on the wiring board 11, the flexible circuit boards 30 may be deformed in the in-plane directions D of the wiring board 11 as illustrated in FIG. 8B. Thereby, the flexible circuit boards 30 may efficiently absorb the difference in thermal expansion between the wiring board 11 and the semiconductor package 20 in the in-plane directions D. Thus, it may be possible to achieve the improvement in connection reliability by the flexible circuit boards 30.

Next, a method of fabricating the flexible circuit board 30 will be described.

FIGS. 10A to 10D are cross-sectional views of the flexible circuit board 30 in the course of the fabricating thereof. FIGS. 11A and 11B are plan views thereof.

Figure 10A:
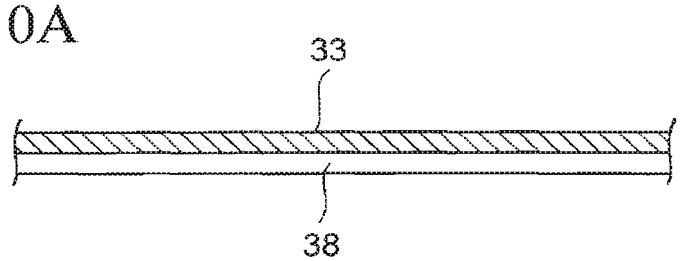
FIGS. 10A to 10D are cross-sectional views of the flexible circuit board in the course of the fabricating thereof according to each embodiment.
Figure 11A:
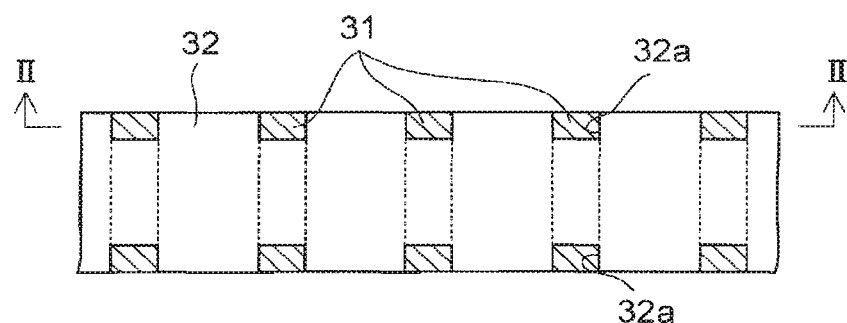
FIGS. 11A and 11B are plan views of the flexible circuit board in the course of the fabricating thereof according to each embodiment.
Figure 11B:
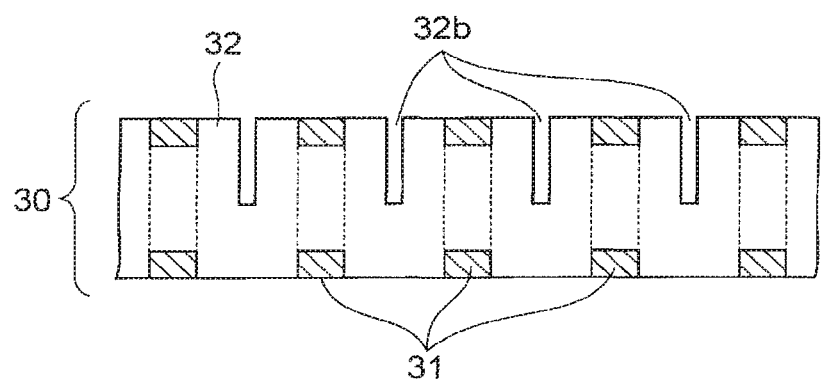

To fabricate the flexible circuit board 30, firstly, as illustrated in FIG. 10A, a copper foil 33 is bonded onto a main surface of the first resin film 38 made of polyimide having a thickness of approximately 0.25 mm with an unillustrated adhesive (thickness: approximately 0.25 mm). The thickness of the copper foil 33 is not particularly limited, but is approximately 0.35 mm in this embodiment.

Incidentally, as the material of the first resin film 38, a material other than polyimide, for example, epoxy, acrylic, phenol, or the like may be used.

Figure 10B:
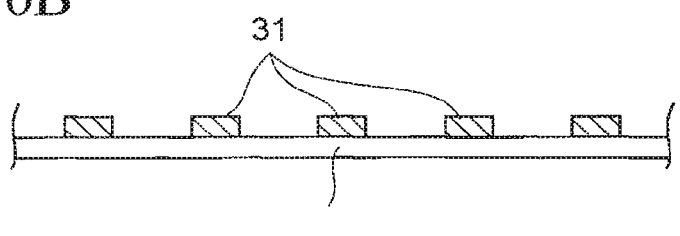
Figure 10C:
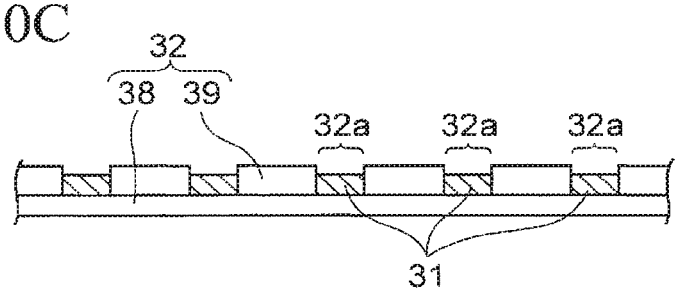

Then, as illustrated in FIG. 10B, the copper foil 33 is patterned by photolithography and wet etching to form the interconnections 31. The width of the interconnections 31 obtained by this patterning is, for example, approximately 0.5 mm.

Subsequently, the second resin film 39 having the openings 32a formed in advance is prepared as illustrated in FIG. 10O. Then, the second resin film 39 is pasted on the first resin film 38 with an unillustrated adhesive by pressing, and the resin base material 32 including the resin films 38, 39 is obtained.

The material of the second resin film 39 is not particularly limited, and a film made of any one of polyimide, epoxy, acrylic, and phenol may be used as the second resin film.

In a case where the resin films 38, 39 are pasted on each other at low temperature, any one of epoxy, acrylic, and phenol described above is preferably used as the material of these resin films.

Moreover, the thickness of the second resin film 39 is not particularly limited, but is approximately 0.25 mm in this embodiment.

Figure 10D:
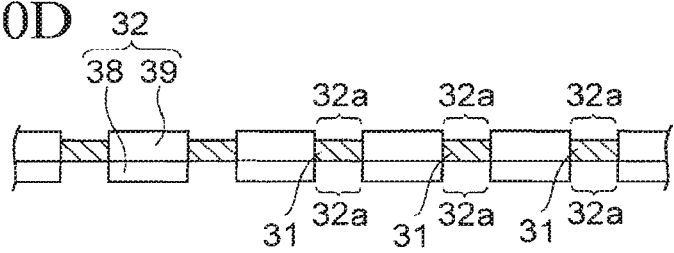

Thereafter, as illustrated in FIG. 10D, the openings 32a are formed in the first resin film 38 by laser processing, and thus end portions of the interconnections 31 are exposed from the openings 32a.

As described with reference to FIGS. 8A and 8B, the openings 32a formed in the above manner may increase the contact area between the interconnections 31 and the connection media 41, 42 in the openings 32a.

Note that, although the openings 32a are formed in both of the resin films 38, 39 in this example, the contact area between the interconnections 31 and the connection media 41, 42 may be increased even if the openings 32a are formed only in one of these resin films 38, 39.

FIG. 11A is an enlarged plan view of the resin base material 32 after the steps so far are completed. FIG. 10D preceded above corresponds to a cross-sectional view taken along the line II-II in FIG. 11A.

After that, as illustrated in FIG. 11B, the slit 32b is mechanically formed in the resin base material 32 at a position between each adjacent two of the plurality of interconnections 31 using a puncher.

Thereby, a basic structure of the stress-relaxing flexible circuit board 30 is completed.

In manufacturing the semiconductor device, a plurality of such flexible circuit boards 30 are fabricated, each of which is assembled into a lattice pattern as illustrated in FIGS. 4A and 43.

Figure 12A:
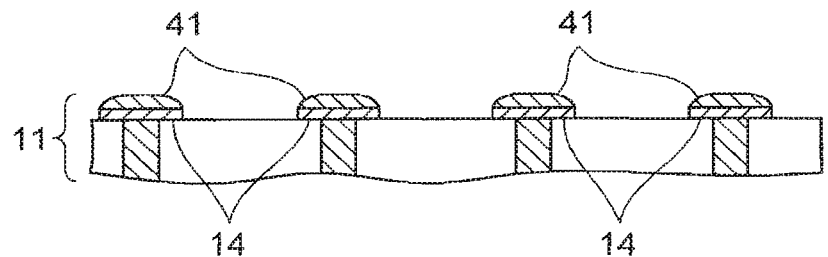
FIGS. 12A to 12C are cross-sectional views of the semiconductor device in the course of the manufacturing thereof using the flexible circuit board according to the first embodiment.
Figure 12B:
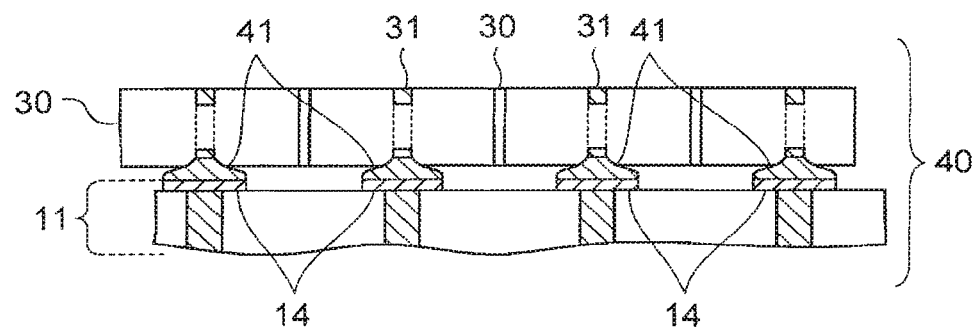
Figure 12C:
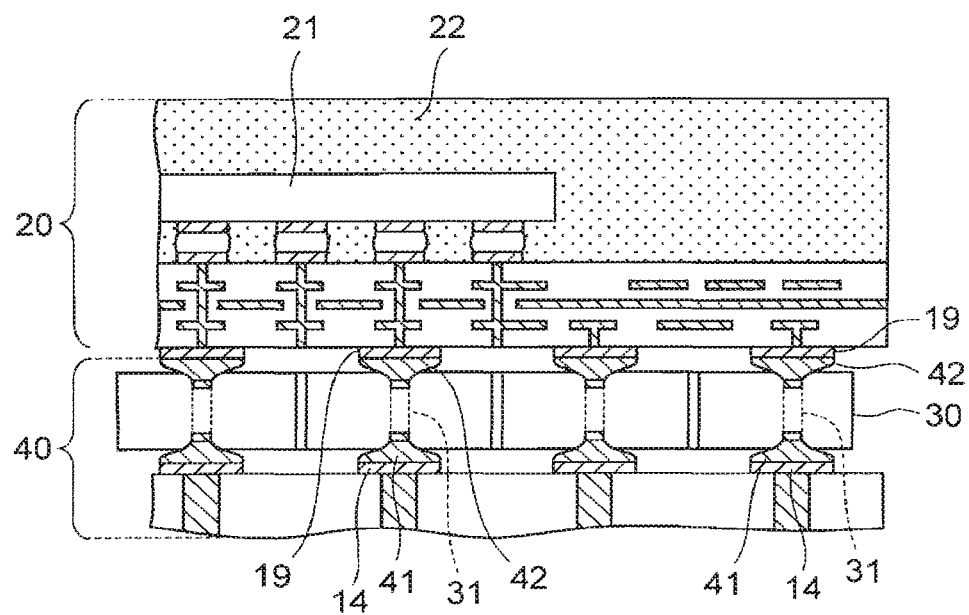

FIGS. 12A to 12C are cross-sectional views of the semiconductor device in the course of the manufacturing thereof using the flexible circuit boards 30 thus assembled. Note that, in FIGS. 12A to 12O, the same reference numerals as in FIGS. 8A and 8B denote the same elements described in the drawings, and descriptions thereof will be omitted below.

To manufacture the semiconductor device 10, firstly, as illustrated in FIG. 12A, Sn-3Ag-0.5Cu solder is printed in advance as the first connection media 41 on the first electrode pads 14 of the wiring board 11.

Incidentally, instead of such a printing method, solder balls may be mounted in advance as the first connection media 41 on the first electrode pads 14.

Then, as illustrated in FIG. 12B, the first electrode pads 14 and the flexible circuit boards 30 are positioned to each other, and the plurality of flexible circuit boards 30 assembled in the lattice pattern are mounted on the wiring board 11. The assembling into such a lattice pattern may enable the circuit boards 30 to maintain the standing state on the wiring board 11 by themselves without support.

Thereafter, the solder in the first connection media 41 is reflowed by heating to a temperature at its melting point of 220° C. or higher.

After that, the first connection media 41 are cooled and solidified. Thereby, the interconnections 31 of the flexible circuit boards 30 are connected to the first electrode pads 14 with the first connection media 41 interposed therebetween.

In addition, the flexible circuit boards 30 are temporarily fixed onto the wiring board 11 by the first connection media 41.

Thus, an electronic component 40 is obtained in which the flexible circuit boards 30 are disposed to stand on the wiring board 11.

Subsequently, as illustrated in FIG. 12C, the semiconductor package 20 is mounted on the electronic component 40. In this event, Sn-3Ag-0.5Cu solder is printed in advance as the second connection media 42 on the second electrode pads 19 of the semiconductor package 20. The semiconductor package 20 is mounted on the flexible circuit boards 30 with the second connection media 42 interposed therebetween.

Incidentally, instead of forming the second connection media 42 by the printing method, solder balls may be mounted as the second connection media 42 on the second electrode pads 19.

Thereafter, the solder in the second connection media 42 in this state is reflowed by heating to a temperature at its melting point of 220° C. or higher.

After that, the second connection media 42 are cooled and solidified. Thereby, the interconnections 31 of the flexible circuit boards 30 are connected to the second electrode pads 19 with the second connection media 42 interposed therebetween. In addition, the semiconductor package 20 is fixed onto the flexible circuit boards 30 by the second connection media 42.

Thereby, a basic structure of the semiconductor device according to the present embodiment is obtained.

Incidentally, although solder is used as the first and second connection media 41, 42 in the above description, a conductive adhesive may be used instead.

Further, in the above description, stress-absorbing flexible circuit boards 30 are placed between the semiconductor package 20 and the wiring board 11. The positions where the circuit boards 30 are disposed are not limited thereto.

Figure 13:
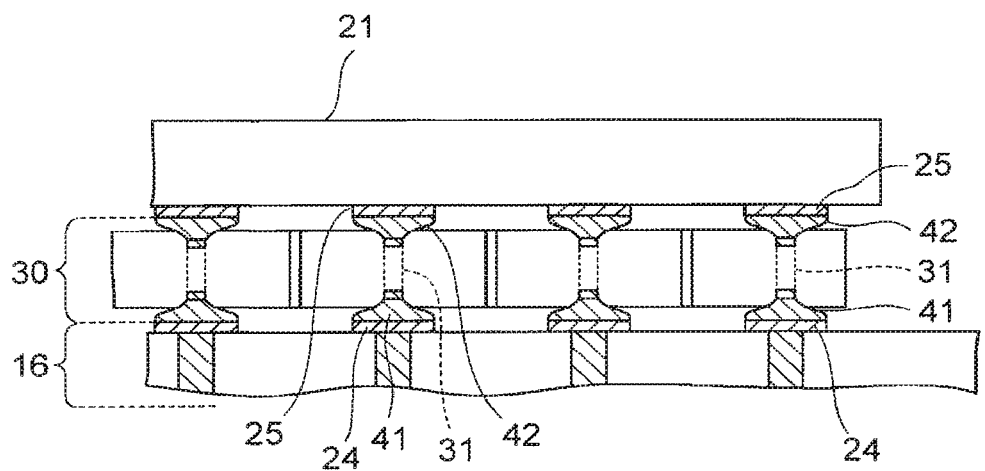
FIG. 13 is a cross-sectional view in a case where the flexible circuit board is placed between the interposer and a semiconductor element in the first embodiment.

For example, as illustrated in an enlarged cross-sectional view of FIG. 13, to connect the interposer 16 to the semiconductor element 21, the flexible circuit boards 30 may be placed therebetween. Note that, in FIG. 13, the same reference numerals as in FIG. 5 denote the same elements in FIG. 5, and descriptions thereof will be omitted below.

In this case, solder or a conductive adhesive is provided in advance as the first and second connection media 41, 42 on the third and fourth electrode pads 24, 25. The circuit boards 30 are electrically and mechanically connected to the third and fourth electrode pads 24, 25 by the connection media 41, 42.

Thereby, the flexible circuit boards 30 may absorb the difference in thermal expansion between the semiconductor element 21 and the interposer 16, and the connection reliability between the semiconductor element 21 and the interposer 16 may be improved.

By standing the flexible circuit boards 30 on the semiconductor board 11 as described above in this embodiment, it may be possible to provide a semiconductor device having improved connection reliability between the wiring board 11 and the semiconductor component such as the semiconductor package 20 and the semiconductor element 21. Moreover, by mounting the semiconductor device on an electronic device such as a server or a personal computer, it may be possible to urge further advancement in performance of the electronic device.

(2) Second Embodiment

The present embodiment is different from the first embodiment in how to assemble the flexible circuit board 30, and is the same as the first embodiment in the other points.

Figure 14:
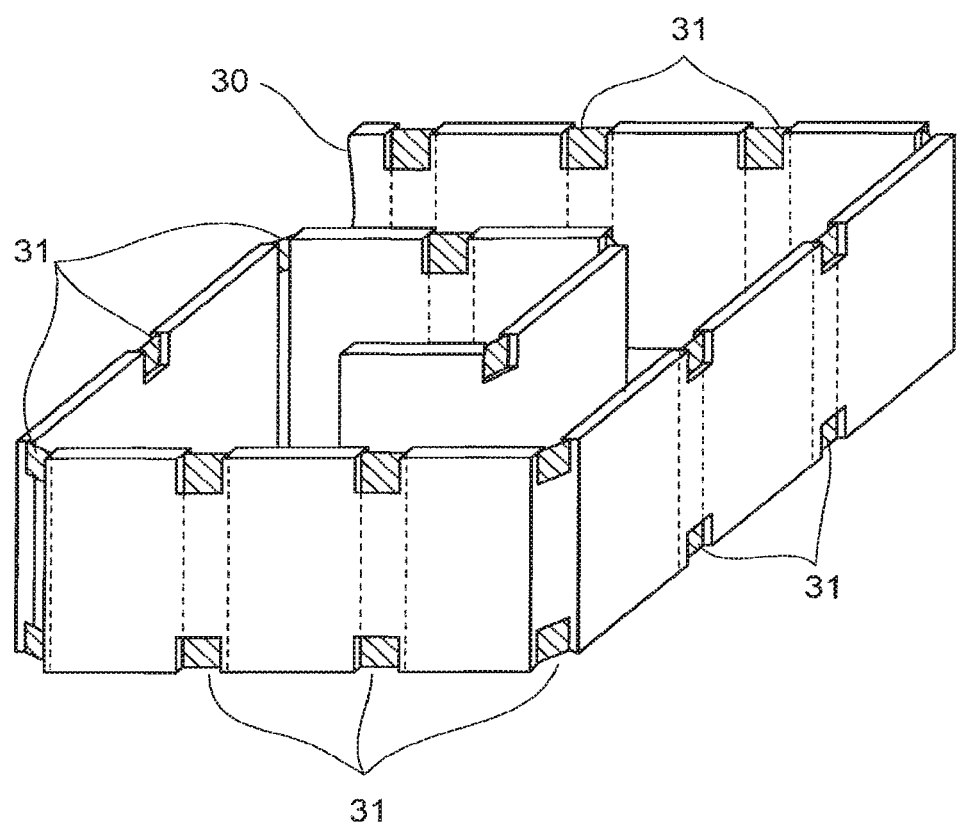
FIG. 14 is a perspective view illustrating a way of using a flexible circuit board according to a second embodiment.

FIG. 14 is a perspective view illustrating a way of using the flexible circuit board 30 according to the present embodiment.

As illustrated in FIG. 14, in this embodiment, the single flexible circuit board 30 is wound spirally.

Figure 15:
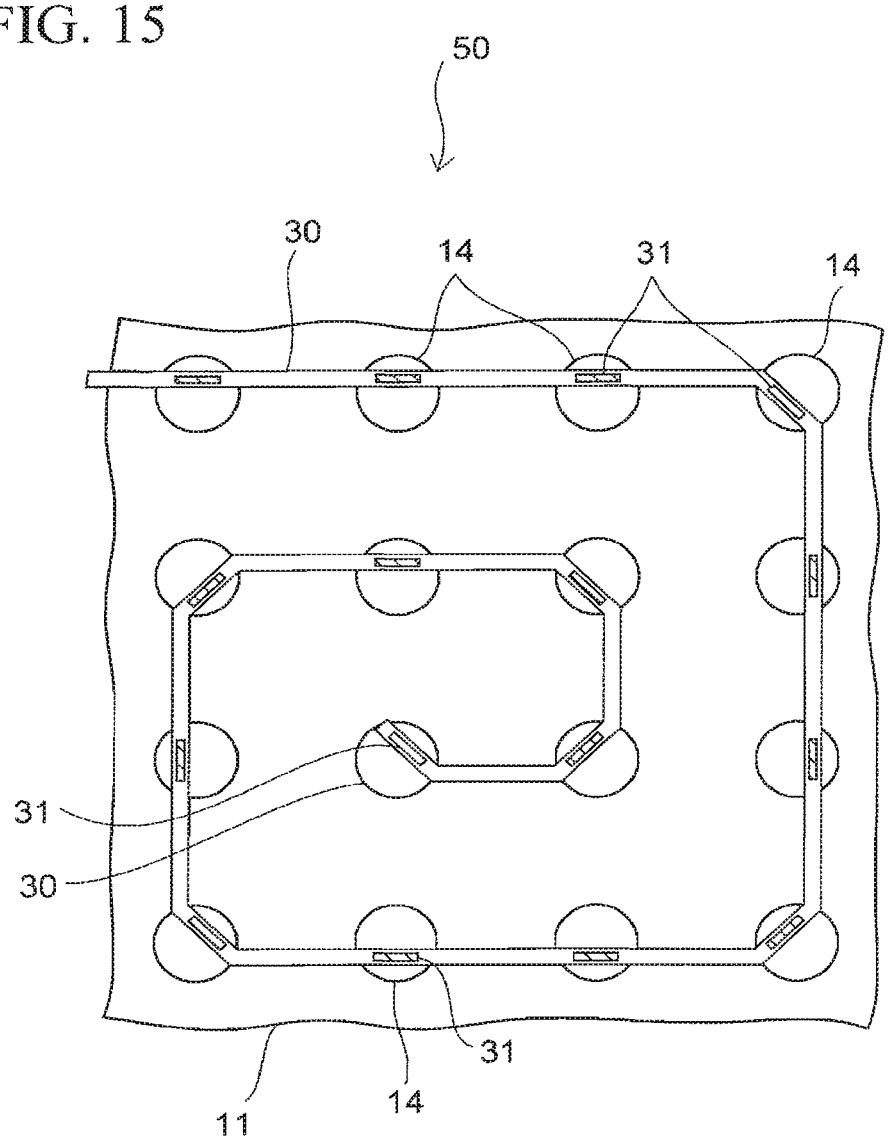
FIG. 15 is an enlarged plan view of an electronic component in which the flexible circuit board according to the second embodiment firmly adheres onto a wiring board.

FIG. 15 is an enlarged plan view of an electronic component 50 in which the flexible circuit board 30 firmly adheres onto the wiring board 11.

As illustrated in FIG. 15, the flexible circuit board 30 is disposed to stand on the wiring board 11 in such a manner that the interconnections 31 run on the first electrode pads 14. In addition, the flexible circuit board 30 is wound spirally by being bent at appropriate positions.

While formed spirally in this manner, even the single flexible circuit board 30 alone may crawl on all the first electrode pads 14. Thus, it may be no longer necessary to prepare a plurality of flexible circuit boards 30 nor to form slits 32b therein to assemble the circuit boards 30 as in the first embodiment. This facilitates processing of the flexible circuit board 30.

Furthermore, by bending the flexible circuit board 30 at appropriate positions, the flexible circuit board 30 may be allowed to crawl on the electrode pads 14 regardless of the planar layout of the first electrode pads 14. Thus, the versatility of the flexible circuit board 30 is enhanced.

(3) Third Embodiment

The present embodiment is different from the first embodiment in how to assemble the flexible circuit board 30, and is the same as the first embodiment in the other points.

Figure 16:
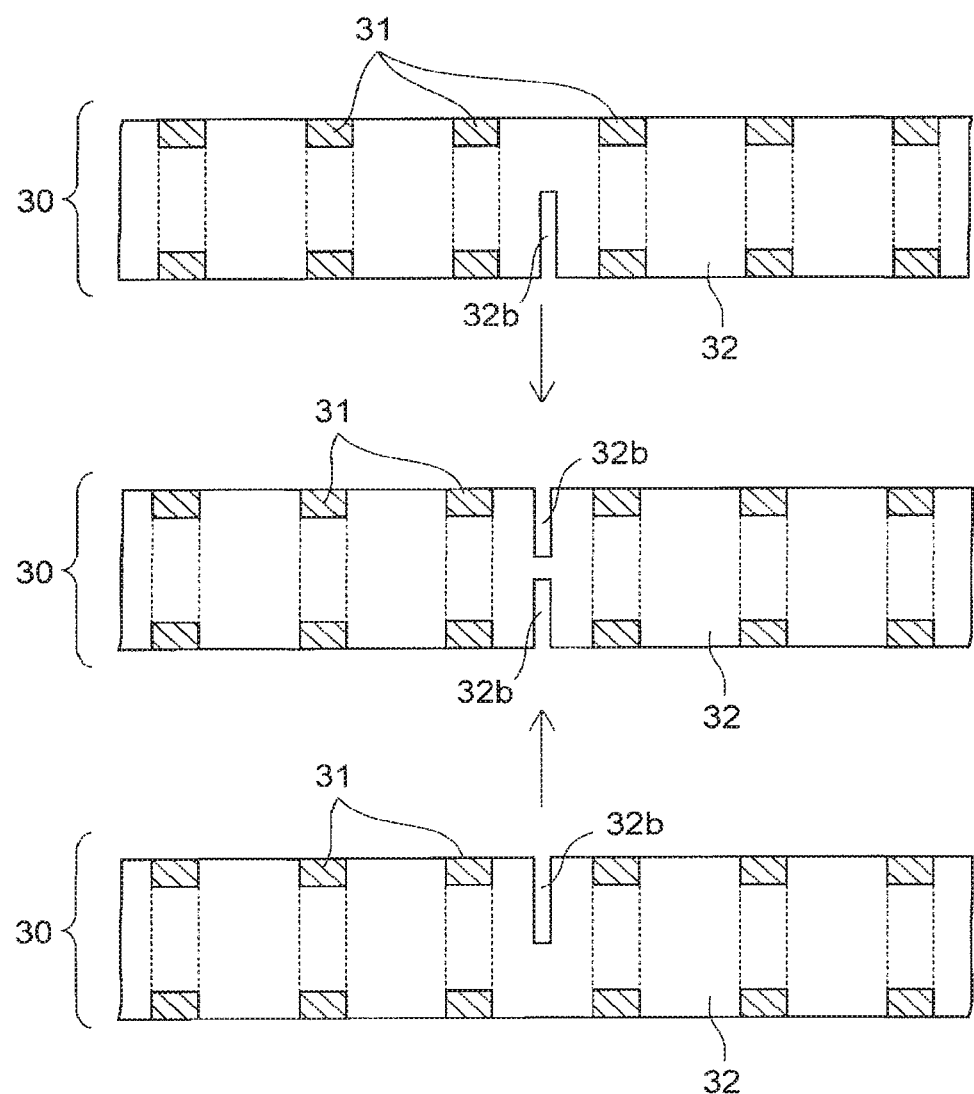
FIG. 16 is an enlarged plan view of three flexible circuit boards used in a third embodiment.

FIG. 16 is an enlarged plan view of three flexible circuit boards 30 used in the present embodiment.

As illustrated in FIG. 16, two of the three flexible circuit boards 30 each have the slit 32b cut from one of the long sides, while the remaining one of the flexible circuit boards 30 has the slits 32b cut from both of the long sides.

When in use, these three flexible circuit boards 30 are assembled in directions of the arrows in the drawing.

Figure 17:
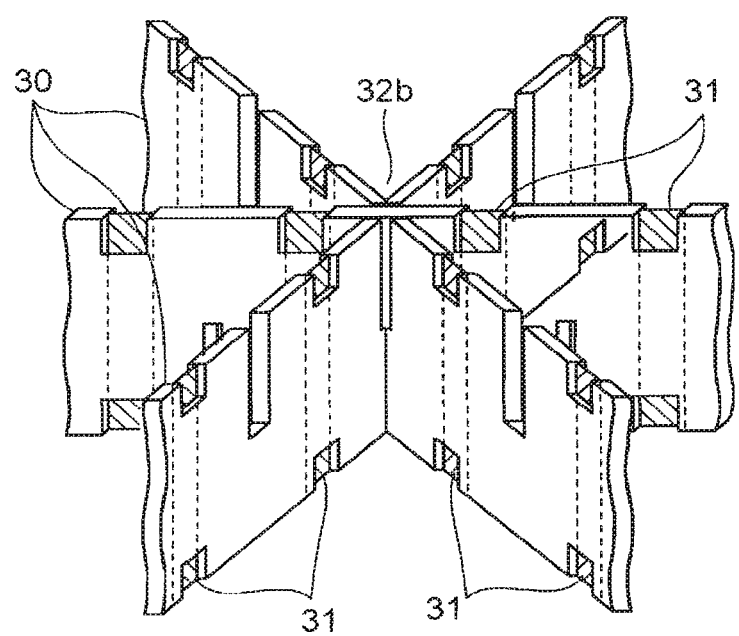
FIG. 17 is a perspective view illustrating a way of using the flexible circuit board according to the third embodiment.

FIG. 17 is a perspective view illustrating a way of using the flexible circuit board 30 according to the present embodiment.

In this embodiment, the slits 32b of the three flexible circuit boards 30 illustrated in FIG. 16 are fitted to each other, so that the flexible circuit boards 30 are radially assembled with the slits 32b as the center as illustrated in FIG. 17.

Figure 18:
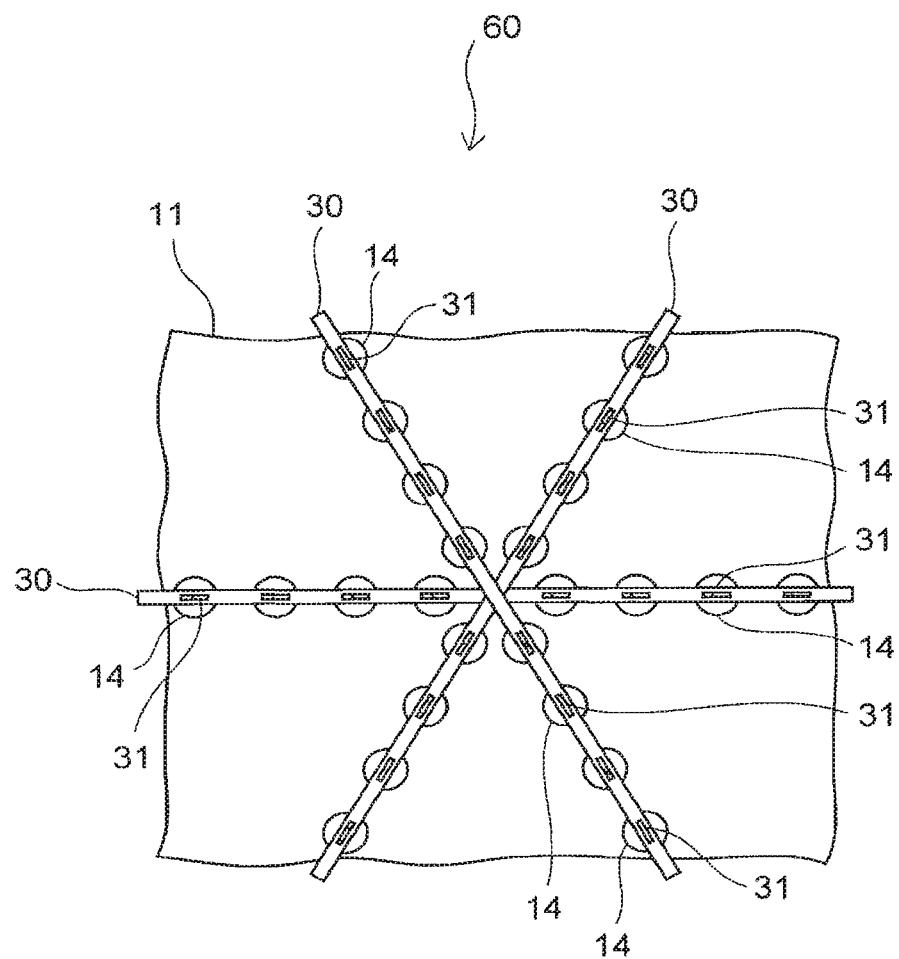
FIG. 18 is an enlarged plan view of an electronic component in which the flexible circuit boards according to the third embodiment firmly adhere onto a wiring board.

FIG. 18 is an enlarged plan view of an electronic component 60 in which the flexible circuit boards 30 thus radially assembled firmly adhere onto the wiring board 11.

As illustrated in FIG. 18, the flexible circuit boards 30 are disposed to stand on the wiring board 11 in such a manner that the interconnections 31 run on the first electrode pads 14.

Even in such a radial form, the flexible circuit boards 30 deform as in the first embodiment. Thereby, the flexible circuit boards 30 may absorb the difference in thermal expansion between the wiring board 11 and the semiconductor package 20, and the connection reliability between the wiring board 11 and the semiconductor package 20 may be improved.

(4) Fourth Embodiment

In this embodiment, a study carried out by the inventors of the present application will be described. In the study, the flexible circuit boards 30 are disposed between the wiring board and the semiconductor package as in the first embodiment, and then it is examined that to what extent the connection reliability between the wiring board and the semiconductor package has been improved.

FIGS. 19A to 19D are cross-sectional views illustrating a method of fabricating a sample used in the study. Note that, in these drawings, the same reference numerals as those in the first embodiment denote the same elements described in the first embodiment, and descriptions thereof will be omitted below.

Figure 19A:
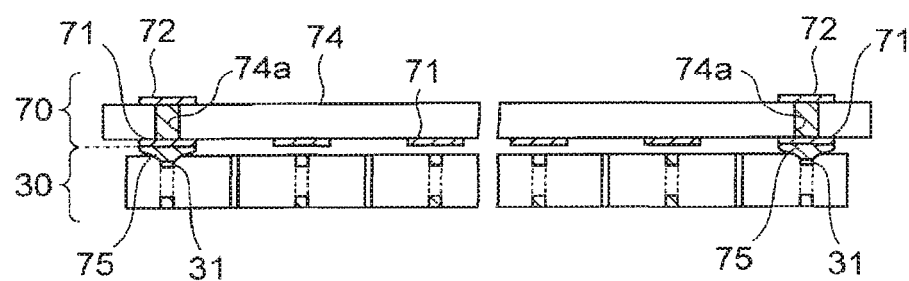
FIGS. 19A to 19D are cross-sectional views illustrating a method of fabricating a sample in a fourth embodiment.

To fabricate the sample, firstly, as illustrated in FIG. 19A, the flexible circuit boards 30 and a package board 70 are prepared.

Among them, the package board 70 functions as a pseudo-semiconductor package in the study, and has first electrode pads 71 and second electrode pads 72 on the respective surfaces of a resin base material 74. Moreover, the first and second electrode pads 71, 72 are connected to each other through via holes 74a formed in the resin base material 74.

Further, the flexible circuit boards 30 and the package board 70 are electrically and mechanically connected to each other with first connection media 75 such as solder interposed therebetween.

Here, in the study, among the plurality of interconnections 31 of the flexible circuit boards 30, interconnections 31 at right and left ends are connected to the first electrode pads 71, while the remaining interconnections 31 are not connected to the package board 70.

Figure 19B:
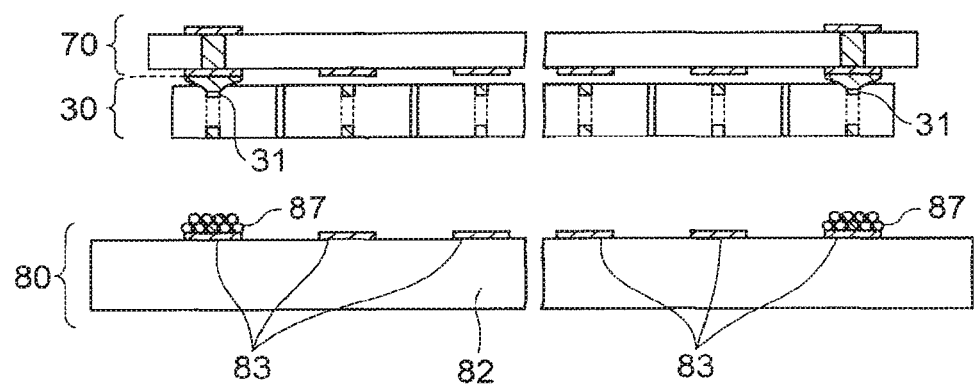

Then, as illustrated in FIG. 19B, a wiring board 80 having a plurality of third electrode pads 83 formed on a resin base material 82 is prepared. Subsequently, a solder paste is printed as second connection media 87 by a printing method or the like on third electrode pads 83 at right and left ends among the plurality of third electrode pads 83.

Figure 19C:
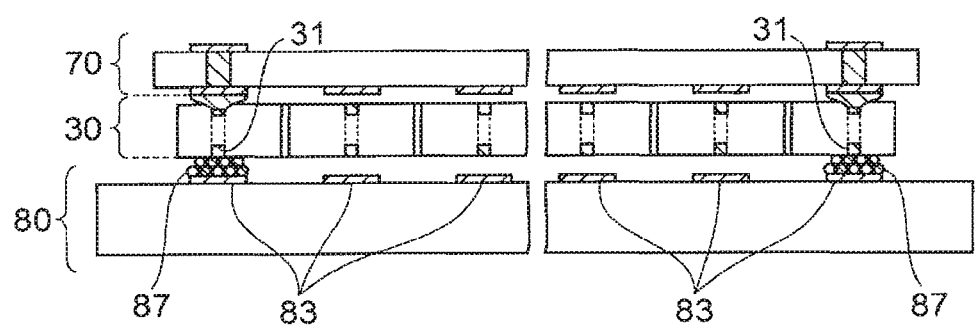

Next, as illustrated in FIG. 19C, the interconnections 31 at both ends of the flexible circuit boards 30 are positioned to the third electrode pads 83 at both ends of the wiring board 80. Then, the flexible boards 30 are made to stand on the second connection media 87.

Figure 19D:
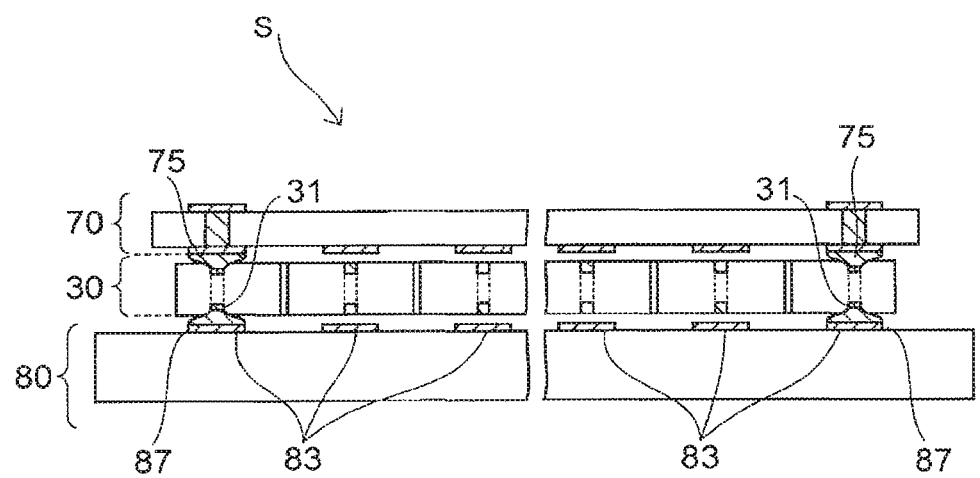

Thereafter, as illustrated in FIG. 19D, the second connection media 87 are reflowed and melted. Thereby, the interconnections 31 of the flexible circuit boards 30 are electrically and mechanically connected to the third electrode pads 83 of the wiring board 80 with the second connection media 87 interposed therebetween.

Note that Sm-37Pb solder is used as the connection media 75, 87.

Thereby, a basic structure of a sample S is completed.

Figure 20:
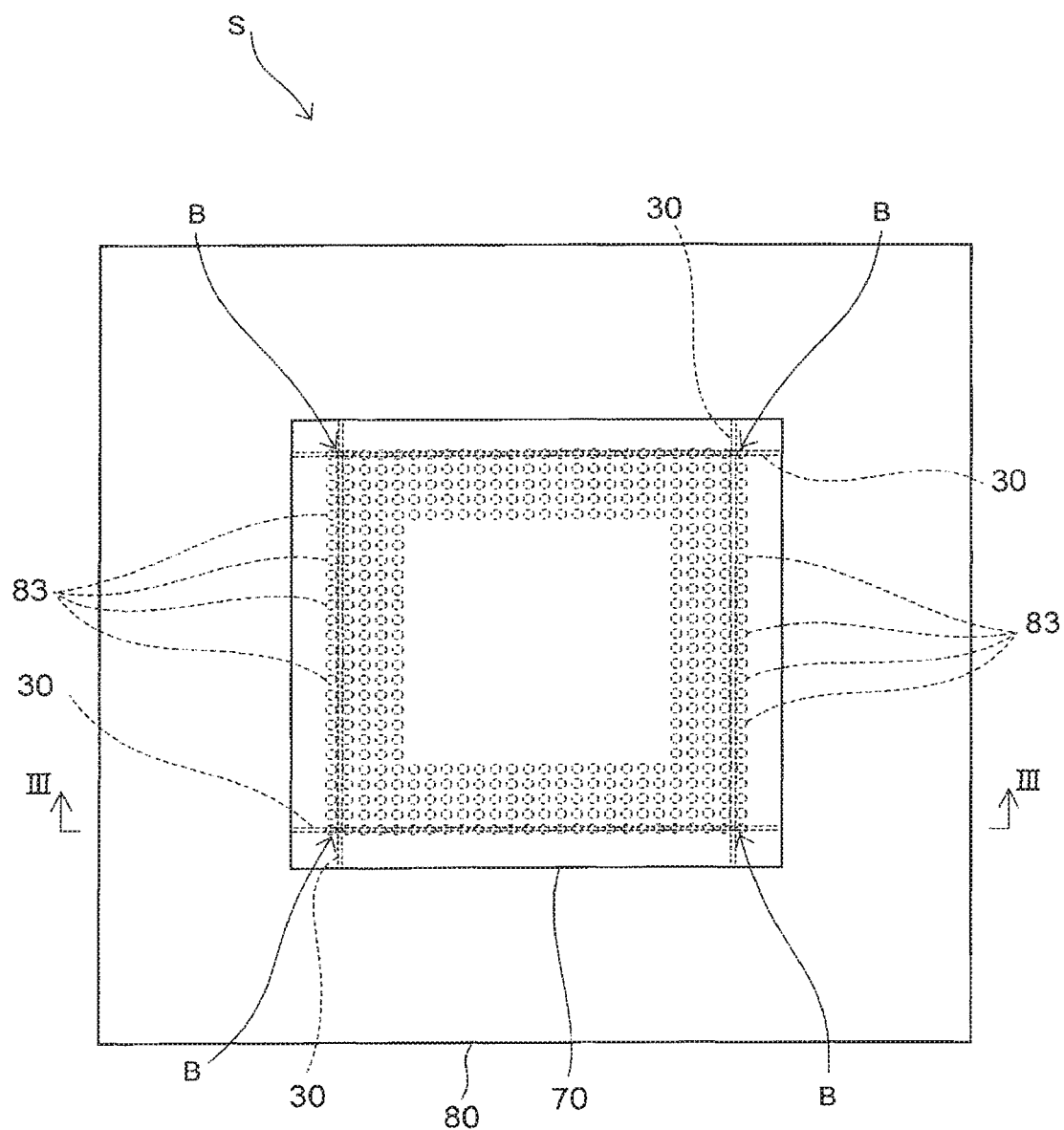
FIG. 20 is a plan view of the sample in the fourth embodiment.

FIG. 20 is a plan view of this sample S. FIG. 19D preceded above corresponds a cross-sectional view taken along the line in FIG. 20.

As illustrated in FIG. 20, in the sample S, four flexible circuit boards 30 are assembled and disposed to stand along edges of the package board 70.

Among these flexible circuit boards 30, two flexible circuit boards 30 disposed opposite to each other at upper and lower portions of the drawing are electrically and mechanically connected to both the package board 70 and the wiring board 80. The two flexible circuit boards 30 are connected to the package board 70 and the wiring board 80 at connection portions B respectively with the first and second connection media 75, 87 interposed therebetween as already mentioned.

Using such a sample S, the inventors of the present application examine the connection reliability in the following way.

Figure 21A:
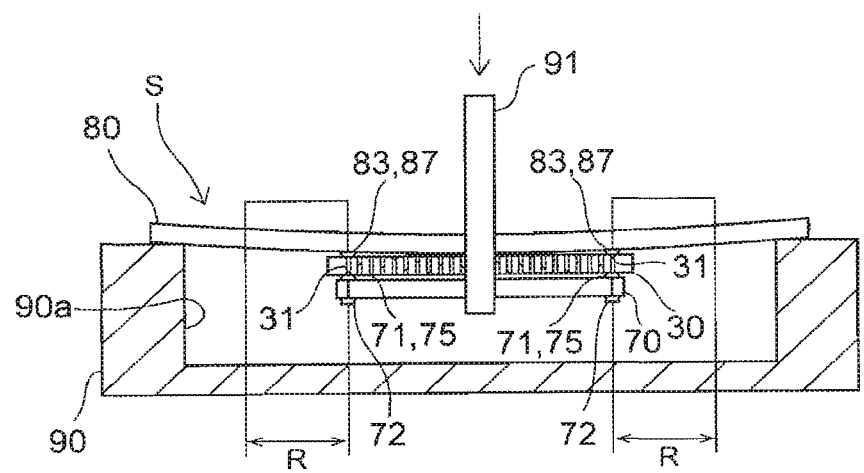
FIGS. 21A and 21B are cross-sectional views for explaining a method of examining the connection reliability of the sample in the fourth embodiment.
Figure 21B:
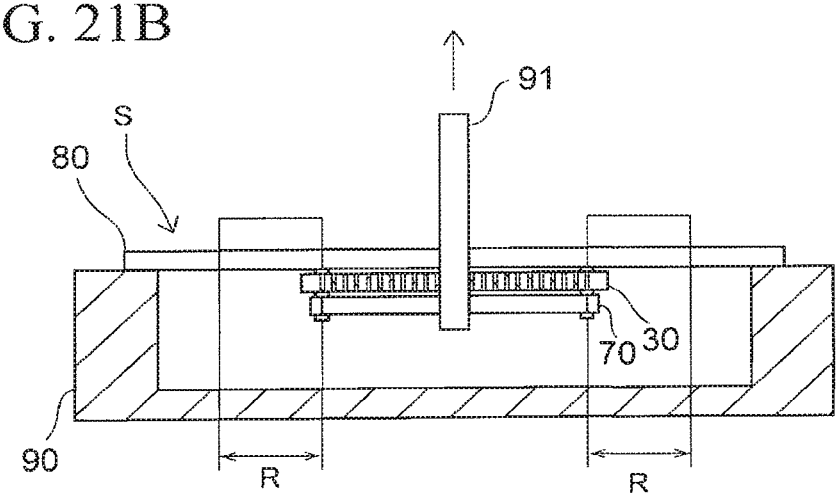

FIGS. 21A and 21B are cross-sectional views for explaining a method of examining the connection reliability.

In the study, the sample S is mounted on a support 90 with the package board 70 at the lower side of the sample S. The support 90 is provided with a recessed portion 90a. The flexible circuit boards 30 and the package board 70 are housed in the recessed portion 90a.

Then, using a piston 91 as in FIG. 21A, the wiring board 80 and the package board 70 are pushed down vertically by 1.5 mm and returned to the initial position as in FIG. 21B. This cycle is repeated at a frequency of 0.5 Hz. Simultaneously with this, a resistance value H between the second electrode pad 72 and the third electrode pad 83 is measured. The measurement is performed in a room with the room temperature of approximately 25° C. Such a study is also called a bending test.

The bending test is expected to be a method in which the lifetime of a bonded portion with respect to fatigue may be measured within a short period, in comparison with a temperature cycle test.

Figure 22:
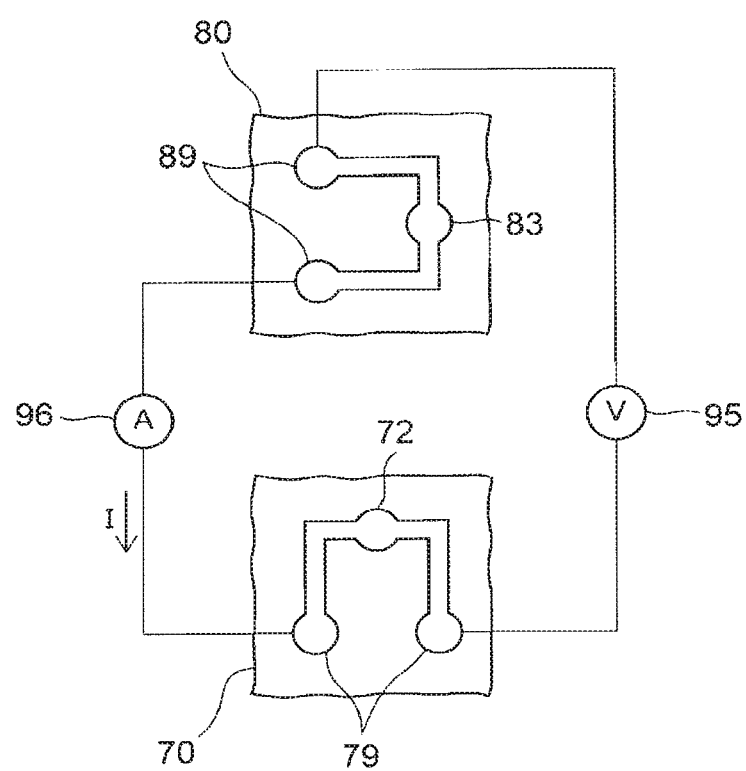
FIG. 22 is a schematic plan view illustrating a method of measuring a resistance value between a second electrode pad and a third electrode pad in the fourth embodiment.

FIG. 22 is a schematic plan view illustrating a method of measuring the resistance value R.

As illustrated in FIG. 22, two first test pads 79 connected to the second electrode pad 72 are disposed on the surface of the package board 70. Moreover, two second test pads 89 electrically connected to the third electrode pad 83 are disposed on the surface of the wiring board 80.

In measuring the resistance value R, a voltage V generated between the third and second electrode pads 83 and 72 is measured with a voltmeter 95, while a constant current I is caused to flow between one of the two first test pads 79 and one of the two second test pads 89 by a direct current generator 96. The resistance value R is obtained from R=V/I.

Figure 1A:
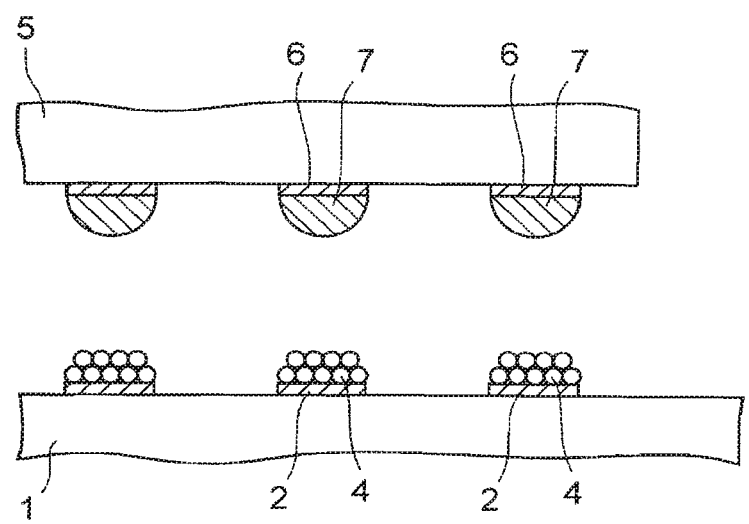
FIGS. 1A and 1B are cross-sectional views of a semiconductor element in the course of the mounting thereof on a wiring board by flip chip mounting.
Figure 1B:
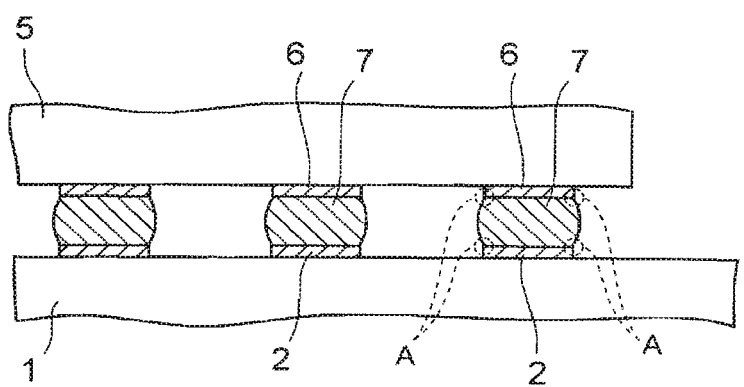

In the study, at the time when the resistance value R is increased higher than the initial value by 1% after the test is started, the connection portion B (see FIG. 20) between the package board 70 and the wiring board 80 is regarded as being broken down. As a result, it is confirmed that the lifetime of the connection portion B in the sample S is 8 times or more as long as that in a case where the boards 70, 80 are connected with the solder bumps 7 interposed therebetween as in FIG. 1B.

Thus, it is supported that connecting the package board 70 and the wiring board 80 with the flexible boards 30 as in the sample S is effective in improving the connection reliability between the boards 70, 80.

All examples and conditional language recited herein are intended for pedagogical purposes to add the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An electronic device comprising a semiconductor device mounted thereon, the semiconductor device comprising:
    a wiring board including a first electrode pad on a surface thereof;
    a plurality of circuit boards having slits that are fitted to each other, the circuit boards being disposed to stand on the wiring board, and including an interconnection connected to the first electrode pad with any one of a first solder and a first conductive adhesive; and
    a semiconductor component disposed to face the wiring board with the circuit board interposed therebetween, and including a second electrode pad on a surface thereof, the second electrode pad being connected to the interconnection with any one of a second solder and a second conductive adhesive, wherein
    the circuit board comprises:
        a first resin film having the interconnection formed on one main surface thereof; and
        a second resin film formed on the interconnection and the first resin film,
    at least one of the first resin film and the second resin film has an opening formed on an end portion of the interconnection to expose the interconnection therefrom, and
    the end portion of the interconnection is connected to any one of the first electrode pad and the second electrode pad.

* * * * *